US00RE39296E

(19) United States
(12) Reissued Patent
Takahashi

(10) Patent Number: US RE39,296 E
(45) Date of Reissued Patent: Sep. 19, 2006

(54) CATADIOPTRIC PROJECTION SYSTEMS

(75) Inventor: Tomowaki Takahashi, Yokohama (JP)

(73) Assignee: Nikon Corporation, Tokyo (JP)

(21) Appl. No.: 09/659,375

(22) Filed: Sep. 8, 2000

Related U.S. Patent Documents

Reissue of:
(64) Patent No.: 5,805,334
Issued: Sep. 8, 1998
Appl. No.: 08/858,560
Filed: May 19, 1997

U.S. Applications:
(63) Continuation-in-part of application No. 08/628,165, filed on Apr. 25, 1996, now Pat. No. 5,689,377, and a continuation-in-part of application No. 08/552,453, filed on Nov. 3, 1995, now Pat. No. 5,691,802, and a continuation-in-part of application No. 08/515,631, filed on Aug. 16, 1995, now Pat. No. 5,861,997, and a continuation-in-part of application No. 08/429,970, filed on Apr. 27, 1995, now Pat. No. 5,808,805, and a continuation-in-part of application No. 08/212,639, filed on Mar. 10, 1994, now Pat. No. 5,636,066.

(30) Foreign Application Priority Data

| | | |
|---|---|---|
| Mar. 12, 1993 | (JP) | 5-051718 |
| Jun. 8, 1993 | (JP) | 5-137641 |
| Apr. 18, 1994 | (JP) | 06-090837 |
| Aug. 23, 1994 | (JP) | 06-198350 |
| Nov. 7, 1994 | (JP) | 06-271631 |
| Mar. 7, 1995 | (JP) | 07-047142 |
| Apr. 7, 1995 | (JP) | 07-082380 |
| Jul. 14, 1995 | (JP) | 07-17785 |
| Feb. 19, 1996 | (JP) | 08-030978 |
| May 20, 1996 | (JP) | 8-149903 |

(51) Int. Cl.
*G02B 17/08* (2006.01)
*G03B 27/42* (2006.01)

(52) U.S. Cl. ..... 359/364; 359/727; 359/732; 359/784

(58) Field of Classification Search ..... 359/364, 359/365, 366, 727, 728, 732, 784
See application file for complete search history.

(56) References Cited

U.S. PATENT DOCUMENTS

| | | | |
|---|---|---|---|
| 3,504,961 | A | 4/1970 | Hoogland et al. |
| 3,737,215 | A | 6/1973 | De Jager |

(Continued)

FOREIGN PATENT DOCUMENTS

| | | |
|---|---|---|
| DE | 19726058 A | 1/1998 |
| EP | 0712019 | 5/1996 |

(Continued)

OTHER PUBLICATIONS

U.S. Appl. No. 09/659,376, filed Sep. 8, 2000, Toshihiro Sasaya, et al., Nikon Corporation, Japan.

(Continued)

*Primary Examiner*—Mark A. Robinson
*Assistant Examiner*—Lee Fineman

(57) ABSTRACT

Catadioptric projection systems are disclosed for projecting an illuminated region of a reticle onto a corresponding region on a substrate. The systems are preferably used with ultraviolet light sources (e.g., 193 nm). The systems comprise a first imaging system, a concave mirror, and a second imaging system. The first imaging system comprises a single-pass lens group and a double-pass lens group. The single-pass lens group comprises a first negative subgroup, a positive subgroup, and a second negative subgroup. Light from the illuminated region of the reticle passes through the single-pass lens group and the double-pass lens group, and reflects from the concave mirror to pass back through the double-pass lens group to form an intermediate image of the illuminated region of the reticle. The light is then directed to the second imaging system that re-images the illuminated region of the reticle on the substrate. Alternatively, light from the single-pass lens group is reflected by a turning mirror to the double-pass lens group, wherein the light returning through the double-pass lens group continues directly to the second imaging system.

60 Claims, 5 Drawing Sheets

U.S. PATENT DOCUMENTS

| | | | | | |
|---|---|---|---|---|---|
| 3,897,138 | A | | 7/1975 | Kano | |
| 3,909,115 | A | | 9/1975 | Kano | |
| 3,955,883 | A | | 5/1976 | Sugiyama | |
| 4,080,048 | A | | 3/1978 | Kimura | |
| 4,386,828 | A | | 6/1983 | Hirose | |
| 4,497,015 | A | | 1/1985 | Konno et al. | |
| 4,592,625 | A | | 6/1986 | Uehara et al. | |
| 4,666,273 | A | | 5/1987 | Shimizu et al. | |
| 4,685,777 | A | | 8/1987 | Hirose | |
| 4,701,035 | A | | 10/1987 | Hirose | |
| 4,770,477 | A | | 9/1988 | Shafer | |
| 4,779,966 | A | * | 10/1988 | Friedman | |
| 4,812,028 | A | | 3/1989 | Matsumoto | |
| 4,851,978 | A | | 7/1989 | Ichihara | |
| 4,953,960 | A | | 9/1990 | Williamson | |
| 4,974,919 | A | | 12/1990 | Muraki et al. | |
| 5,052,763 | A | | 10/1991 | Singh et al. | |
| 5,089,913 | A | * | 2/1992 | Singh et al. | |
| 5,194,893 | A | | 3/1993 | Nishi | |
| 5,212,593 | A | | 5/1993 | Williamson et al. | |
| 5,220,454 | A | | 6/1993 | Ichihara et al. | |
| 5,241,423 | A | | 8/1993 | Chiu et al. | |
| 5,253,110 | A | | 10/1993 | Ichihara et al. | |
| 5,260,832 | A | | 11/1993 | Togino et al. | |
| 5,323,263 | A | | 6/1994 | Schoemakers | |
| 5,333,035 | A | | 7/1994 | Shiraishi | |
| 5,365,051 | A | | 11/1994 | Suzuki et al. | |
| 5,402,267 | A | | 3/1995 | Furter et al. | |
| 5,406,415 | A | | 4/1995 | Kelly | |
| 5,414,551 | A | | 5/1995 | Okazaki et al. | |
| 5,506,684 | A | | 4/1996 | Ota et al. | |
| 5,515,207 | A | | 5/1996 | Foo | |
| 5,534,970 | A | | 7/1996 | Nakashima et al. | |
| 5,537,260 | A | | 7/1996 | Williamson | |
| 5,583,696 | A | | 12/1996 | Takahashi | |
| 5,591,958 | A | | 1/1997 | Nishi et al. | |
| 5,592,329 | A | * | 1/1997 | Ishiyama et al. | 359/727 |
| 5,636,066 | A | | 6/1997 | Takahashi | |
| 5,668,673 | A | * | 9/1997 | Suenaga et al. | 359/727 |
| 5,689,377 | A | * | 11/1997 | Takahashi | 357/727 |
| 5,691,802 | A | * | 11/1997 | Takahashi | 359/727 |
| 5,694,241 | A | * | 12/1997 | Ishiyama et al. | 359/727 |
| 5,706,137 | A | | 1/1998 | Kelly | |
| 5,742,436 | A | | 4/1998 | Furter | |
| 5,808,805 | A | | 9/1998 | Takahashi | |
| 6,157,498 | A | | 12/2000 | Takahashi | |

FOREIGN PATENT DOCUMENTS

| | | | | |
|---|---|---|---|---|
| EP | 0717299 | | | 6/1996 |
| EP | 0736789 | A | | 10/1996 |
| EP | 0770895 | | | 5/1997 |
| EP | 0243950 | | | 11/1997 |
| JP | 47-35017 | | | 9/1972 |
| JP | 58-04112 | | | 1/1983 |
| JP | 58-078115 | | | 5/1983 |
| JP | 61-156737 | | * | 7/1986 |
| JP | 63-163319 | | * | 7/1988 |
| JP | 2-66510 | | * | 3/1990 |
| JP | 3-282527 | | * | 12/1991 |
| JP | 4-42208 | | | 2/1992 |
| JP | 4-157412 | | | 5/1992 |
| JP | 4-234722 | | * | 8/1992 |
| JP | 5-72478 | | * | 3/1993 |
| JP | 5-173065 | | | 7/1993 |
| JP | 05-173065 | | | 7/1993 |
| JP | 6-313845 | | | 11/1994 |
| JP | 07140384 | | | 6/1995 |
| JP | 07140385 | | | 6/1995 |
| WO | 93/04391 | | | 3/1993 |

OTHER PUBLICATIONS

U.S. Appl. No. 09/665,184, filed Sep. 5, 2000, Tomowaki Takahashi, Nikon Corporation, Japan.

U.S. Appl. No. 09/766,486, filed Jan. 19, 2001, Tomowaki Takahashi, Nikon Corporation, Japan.

U.S. Appl. No. 09/764,157, filed Jan. 19, 2001, Tomowaki Takahashi, Nikon Corporation, Japan.

U.S. Appl. No. 09/709,518, filed Nov. 13, 2000, Hitoshi Matsuzawa, et al., Nikon Corporation, Japan.

Abstract for Japanese Publication No. 63–118115 filed Jun. 11, 1986.

* cited by examiner

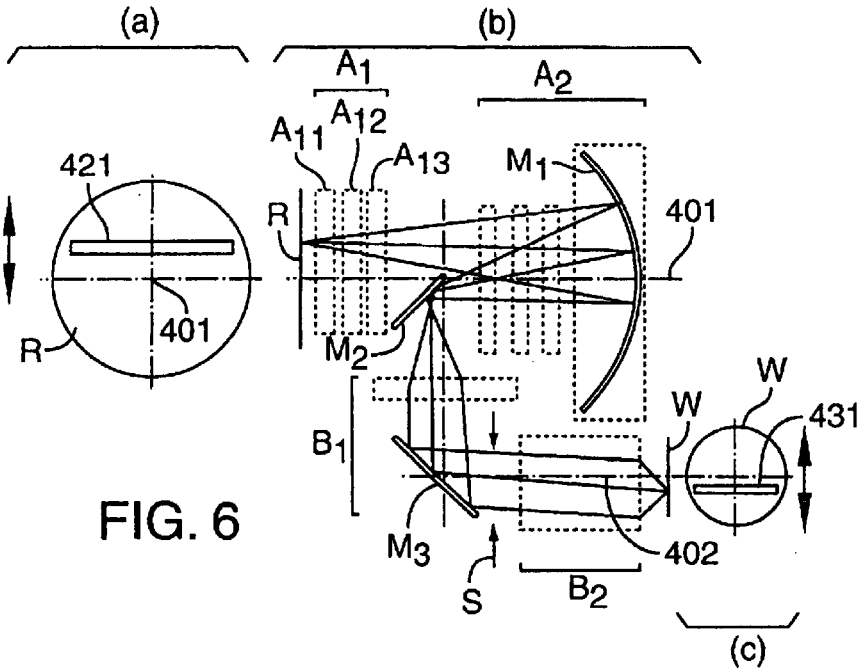
FIG. 6
FIG. 7 (Prior Art)
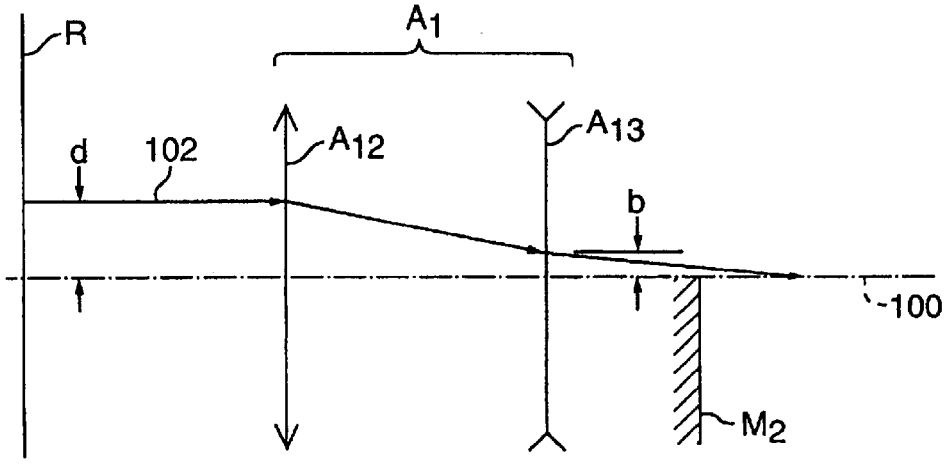

CATADIOPTRIC PROJECTION SYSTEMS

Matter enclosed in heavy brackets [ ] appears in the original patent but forms no part of this reissue specification; matter printed in italics indicates the additions made by reissue.

*This application claims the benefit of Japanese patent application no. 8-149903, filed May 20, 1996, and is a continuation in part of U.S. patent application Ser. No. 08/212,639, filed Mar. 10, 1994 and which issued as U.S. Pat. No. 5,636,066, U.S. patent application Ser. No. 08/628,165, filed Apr. 25, 1996 and which issued as U.S. Pat. No. 5,689,377, U.S. patent application Ser. No. 08/552,453, filed Nov. 3, 1995 and which issued as U.S. Pat. No. 5,691,802, U.S. patent application Ser. No. 08/429,970, filed Apr. 27, 1995 and which issued as U.S. Pat. No. 5,808,805 and is currently pending as U.S. reissue application Ser. No. 09/764,157, U.S. patent application Ser. No. 08/515,631, filed Aug. 16, 1995 and which issued as U.S. Pat. No. 5,861,997 and is currently pending as U.S. reissue application Ser. No. 09/766,486, which correspondingly claim priority under 35 U.S.C. Section 119(a)-(d) to Japanese patent application no. 5-051718, filed Mar. 12, 1993, Japanese patent application no. 5-137641, filed Jun. 8, 1993, Japanese patent application no. 7-082380, filed Apr. 7, 1995, Japanese patent application no. 8-030978, filed Feb. 19, 1996, Japanese patent application no. 6-271631, filed Nov. 7, 1994, Japanese patent application no. 7-047142, filed Mar. 7, 1995, Japanese patent application no. 7-177858, filed Jul. 14, 1995, Japanese patent application no. 6-090837, filed Apr. 28, 1994, and Japanese patent application no. 6-198350, filed Aug. 23, 1994.*

FIELD OF THE INVENTION

This invention pertains to catadioptric projection systems suitable for use with ultraviolet light sources and applicable to steppers and microlithography systems for the manufacture of semiconductors and liquid crystal display panels.

BACKGROUND OF THE INVENTION

Semiconductor device geometries continue to grow smaller. Because the manufacture of semiconductor devices requires the transfer of high-resolution circuit patterns be transferred to semiconductor wafers, the microlithography systems that project these circuit patterns onto semiconductor wafers must form high-resolution images.

The resolution of microlithography systems has been improved in several ways. For example, high-resolution microlithography systems use ultraviolet light instead of visible light and have high numerical aperture optical systems.

Various types of high-resolution optical projection systems have been considered for high-resolution microlithography systems. Purely refractive projection systems are inadequate [al] *at* ultraviolet wavelengths. For wavelengths below 300 nm, only a few optical materials are transmissive and refractive optical elements generally must be made of either synthetic fused quartz or fluorite. Unfortunately, combining optical elements of synthetic fused quartz and fluorite is ineffective in eliminating chromatic aberration because the Abbe numbers of synthetic quartz and fluorite are not sufficiently different. Therefore, refractive optical systems for wavelengths less than about 300 nm suffer from unacceptable levels of chromatic aberration.

Fluorite itself suffers from several disadvantages. The refractive index of fluorite changes relatively rapidly with temperature and fluorite polishes poorly. Therefore, most ultraviolet optical systems do not use fluorite, and thus exhibit uncorrected chromatic aberration.

Purely reflective projection systems avoid these difficulties, but a reflective projection system typically requires a large diameter mirror; frequently, the mirror must be aspheric. Because the manufacture of precision aspheric surfaces is extremely difficult, a reflective projection system using an aspheric mirror is prohibitively expensive.

Catadioptric projection systems have also been used. A catadioptric projection system is a projection system that uses both reflective elements (mirrors) and refractive elements (lenses). Many catadioptric projection systems for microlithography systems form at least one intermediate image within the optical system. Examples include the catadioptric projection systems of Japanese laid-open patent documents 5-25170 (1993), 63-163319 (1988), and 4-234722 (1992), and U.S. Pat. No. 4,779,966.

Japanese laid-open patent document 4-234722 (1992) and U.S. Pat. No. 4,779,966 describe catadioptric projection systems comprising a concave mirror and double-pass lens groups having negative power. In these systems, an incident light beam propagates through the double-pass lens group in a first direction, strikes the concave mirror, and then propagates as a reflected light beam through the double-pass lens group in a second direction opposite to the first direction. In these prior-art systems, the double-pass lens groups have negative power. For this reason, light incident to the concave mirror is divergent and the diameter of the concave mirror must be large.

The double-pass optical system of Japanese laid-open patent document 4-234722 (1992) is symmetric; aberrations in this optical system are extremely low, simplifying aberration correction in the subsequent refractive optical system. However, because it is symmetric, the optical system has a short working distance. In addition, because it is difficult with this system to separate the incident light beam and the reflected light beam, a beamsplitter is required. The preferable location for the beamsplitter in such a projection system is near the concave mirror. Consequently, the beamsplitter is large, heavy, and expensive.

The optical system of U.S. Pat. No. 4,779,966 comprises a concave mirror in a second imaging system. In this system, diverging light enters the concave mirror and the concave mirror must have a large diameter.

Optical systems comprising more than one mirror can use fewer lenses than a purely refractive optical system, but other problems arise. In order to increase resolution and depth of focus, phase-shift masks are frequently used. In order to effectively use a phase-shift mask, the ratio [a] $\sigma$ of the numerical aperture of the irradiation optical system and the numerical aperture of the projection system should be variable. While an adjustable aperture is easily located in the irradiation optical system, a catadioptric projection system usually has no suitable location for a corresponding aperture, adjustable or not.

In a catadioptric projection system in which a double-pass lens group is placed within a demagnifying portion of the optical system, the demagnification reduces the distance between the reflecting elements and the semiconductor wafer. This limits the number of lens elements that can be inserted in the optical path, and thus limits the numerical aperture of the projection system and the total optical power available to expose the wafer. Even if a high numerical aperture is possible the working distance (i.e., the distance between the wafer and the most imagewise surface of the optical system) is short.

Prior-art catadioptric projection systems have optical elements arranged along more than one axis, using prisms or mirrors to fold the optical pathway. The alignment of optical elements in a system with more than one axis is expensive and difficult, especially when high resolution is required. Prior-art catadioptric projection systems are also difficult to miniaturize while simultaneously maintaining image quality. In addition, in a miniaturized prior-art catadioptric projection system, the beam-separation mirror that separates the incident light beam from the reflected light beam is likely to obstruct one of these beams.

Increasing the magnification of the intermediate image and moving the beam-separation mirror away from the optical axis have been considered as solutions to this problem. However, changing the magnification of the intermediate image requires changes to the remainder of the optical system to maintain an appropriate magnification on the wafer. This causes loss of image quality.

Moving the beam-separation mirror away from the optical axis without changing the magnification of the intermediate image can be accomplished by using light beams propagating farther off-axis and increasing the diameter of the projection system. Both of these changes are undesirable, leading to a larger, heavier projection system with less resolution.

Some prior-art catadioptric projection systems are used in full-field exposure systems in which patterns from an entire reticle are projected onto the wafer in a single exposure. Examples include the catadioptric projection systems of Japanese laid-open patent documents 2-66510 (1990), 3-282527 (1991), and 5-72478 (1993), and U.S. Pat. No. 5,089,913. These systems have a beamsplitter (or a partially reflecting mirror) placed near a concave mirror. The beamsplitter directs light to the concave mirror and to the wafer. Because the light is divergent near the concave mirror, the beamsplitter must be large. Large beamsplitters made of prisms are expensive and difficult to manufacture; plate-type beamsplitters are difficult to keep precisely planar. Large prisms have other disadvantages, including their weight and the difficulty of obtaining suitable raw material for their manufacture. A large beamsplitter tends to degrade image quality because of non-uniform reflectance, phase change, and absorption. For ultraviolet projection systems, a prism beamsplitter tends to have low transmittance.

In view of the foregoing, improved catadioptric projection systems for microlithography systems are needed.

SUMMARY OF THE INVENTION

This invention provides catadioptric projection systems that are readily miniaturized while maintaining image quality. A catadioptric projection system according to this invention comprises a first imaging system and a second imaging system. The first imaging system comprises a single-pass lens group and a double-pass lens group including a concave mirror. Light from an illuminated region of the reticle returns through the single-pass lens group and then enters the double-pass lens group. Light propagates through the double-pass lens group in a first direction, strikes the concave mirror, and then returns through the double-pass lens group in a second direction opposite the first direction. A turning mirror is provided between the single-pass lens group and the double-pass lens group. In some embodiments of the invention, the turning mirror directs the light from the first imaging system (after reflection by the concave mirror and back through the double-pass lens group) to the second imaging system. In alternative embodiments of the invention, the turning mirror directs light exiting the single-pass lens group to the double-pass lens group. The first imaging system forms an intermediate image of the illuminated region of the reticle near the turning mirror; the second imaging system re-images the intermediate image and forms an image of the illuminated region of the reticle on a substrate, typically a semiconductor wafer.

In such catadioptric projection systems, the diameter of the concave mirror can be kept small, the ratio of the imaging-optical-system numerical aperture and the illumination-optical-system numerical aperture $\sigma$ can be variable, and an appropriate location is available for an aperture if phase-shift masks are used. In addition, such catadioptric projection systems have high numerical apertures and hence provide sufficient irradiation to the wafer as well as conveniently long working distances.

The second imaging system comprises a first lens group and a second lens group.

The single-pass lens group comprises, in order starting at the reticle, a first negative subgroup, a positive subgroup, and a second negative subgroup. Single-pass optical groups with this configuration are compact, producing high-resolution images, and permit separation of incident and reflected light beams. The magnification of the first imaging system can be selected as appropriate while still maintaining excellent optical performance. Thus, the magnification of the intermediate image can be varied. Preferably, either the first imaging system or the second imaging system demagnifies the reticle. Obtaining a demagnification using the first imaging system simplifies the second imaging system.

The first negative subgroup preferably comprises a lens with a concave surface facing the reticle. The second negative subgroup preferably comprises a lens element with a concave surface facing the double-pass lens group.

In one example embodiment, the first imaging system further comprises another turning mirror that receives light transmitted by the single-pass lens group and directs the light along an axis of the double-pass lens group. This embodiment permits the reticle and the wafer to be on substantially the same optical axis.

In another example embodiment, the second imaging system comprises further comprises a turning mirror placed between the first lens group and the second lens group. This turning mirror receives light from the first lens group and directs the light along an axis of the second lens group. This embodiment permits the reticle and wafer to be in parallel planes.

Embodiments of the invention in which the reticle and wafer are in parallel planes or are along the same axis simplify wafer exposure in scanning systems. It will be readily apparent that the invention includes other arrangements of turning mirrors.

The foregoing and other objects, features, and advantages of the invention will become more apparent from the following detailed description which proceeds with reference to the accompanying drawings.

BRIEF DESCRIPTION OF THE DRAWINGS

FIG. 6 shows a catadioptric projection system according to a third example embodiment of the invention.

FIG. 7 is a general schematic representation of a prior-art optical system.

DETAILED DESCRIPTION

For purposes of describing the invention, a "lens element" is a single lens (i.e., a single piece of "glass"); a lens "group" or "subgroup" comprises one or more lens elements. A positive lens, lens group, or subgroup has a positive focal length; a negative lens, lens group, or subgroup has a negative focal length. An "optical axis" is a straight line through centers of curvature of surfaces of optical elements. As will be apparent, an optical system can have more than one optical axis. Distances from an off-axis point to an optical axis are measured along a line through the point and perpendicular to the optical axis.

In order to describe the invention, a representation of a prior-art optical system is first described with reference to FIG. 7. A ray 102 from a location on a reticle R a distance d from an optical axis 100 is incident on a lens group $A_1$. The lens group $A_1$ comprises, in order from the reticle R and along the optical axis 100, a positive subgroup $A_{12}$ and a negative subgroup $A_{13}$. The lens group $A_1$ bends the ray 102 toward the optical axis 100 so that the height b of the ray 102 as it exits the negative subgroup $A_{13}$ is reduced. For this reason, the optical path of the ray 102 is easily blocked by a mirror $M_2$ placed after the negative subgroup $A_{13}$.

Figure 1:
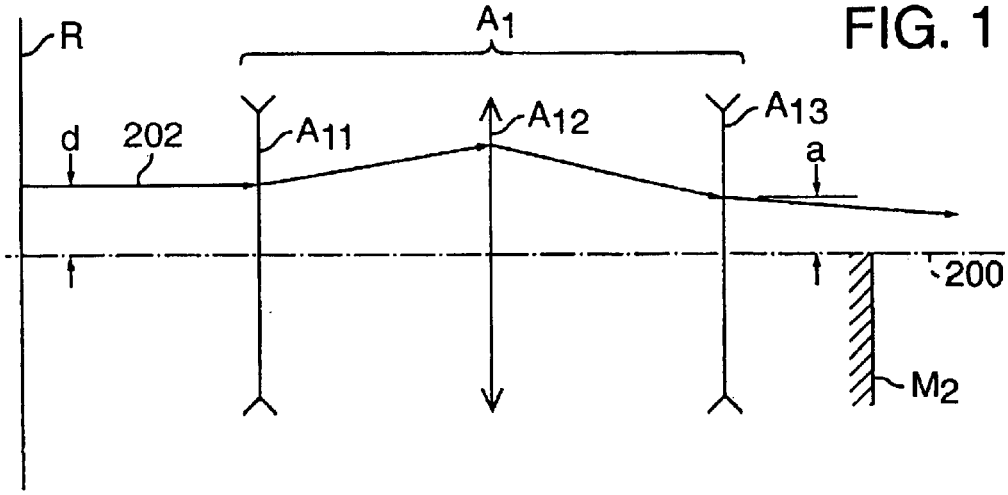
FIG. 1 is a general schematic representation of an optical system according to the invention.

The present invention avoids this problem. With reference to FIG. 1, a ray 202 from a location on a reticle R a distance d from an optical axis 200 is incident to a lens group $A_1$ comprising, in order from the reticle R, a first negative subgroup $A_{11}$, a positive subgroup $A_{12}$, and a second negative subgroup $A_{13}$. The first negative subgroup $A_{11}$, bends the ray 202 away from the optical axis 200. The positive subgroup $A_{12}$ then bends the ray 202 towards the optical axis 200. The height a of the ray 202 exiting the second negative subgroup $A_{13}$ is thus increased in comparison with the prior-art system of FIG. 7, thereby reducing the likelihood of obstruction of the ray 202 by a mirror $M_2$.

Because rays from the reticle R are more distant from the optical axis 200, the lens group $A_1$ of FIG. 1 reduces the possibility of obstruction of rays from the reticle R by the mirror $M_2$. Optical systems using such lens groups can be more compact and provide enhanced image quality in comparison with prior-art optical systems.

Figure 2:
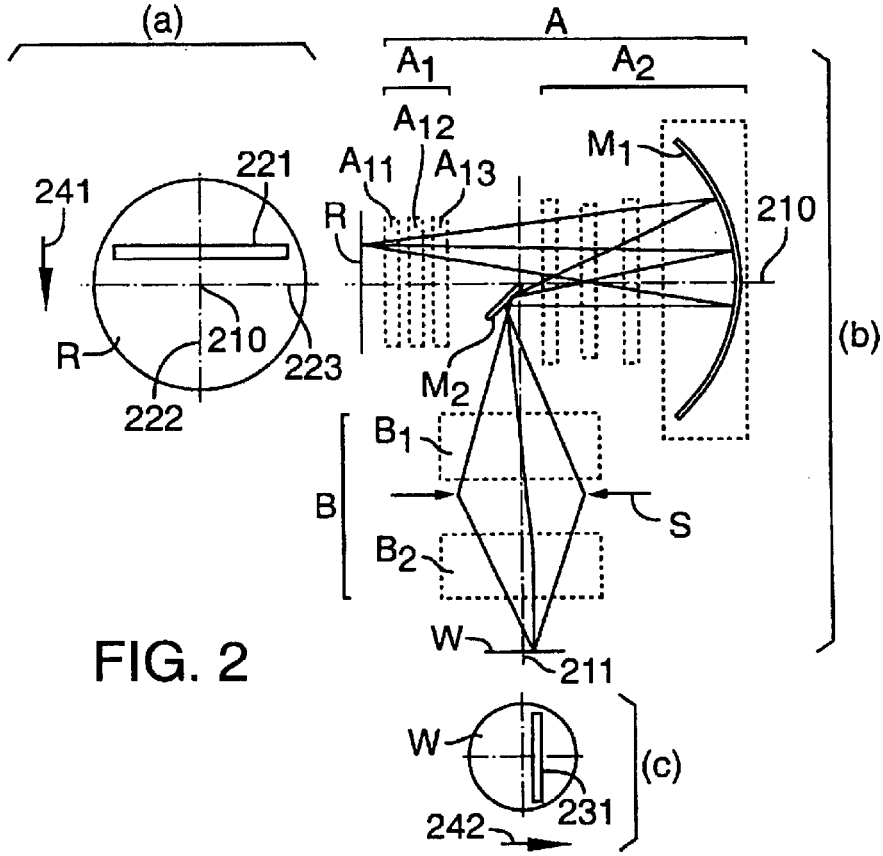
FIG. 2 shows a catadioptric projection system according to a first example embodiment of the invention.

FIG. 2 shows a first example embodiment of the invention. The first example embodiment provides a catadioptric projection system that projects a demagnified image of a circuit pattern from an illuminated region 221 (FIG. 2(a)) of a reticle R onto a semiconductor wafer W. The illumination region 221 is illuminated by an illumination optical system, not shown in FIG. 2. Such a projection system can project a pattern onto other substrates as well, such as a glass panel for a liquid crystal display, and it is apparent that the invention is not limited to systems for projecting circuit patterns onto semiconductor wafers. (Thus, it will be understood that "wafer" as used herein encompasses any of various appropriate substrates onto which an image, defined by the reticle R, can be projected.) In the example embodiments presented herein, the optical projection systems are intended for use at wavelengths around 193 nm but it will be apparent that the invention is also applicable to other wavelengths.

The optical projection system (FIG. 2(b)) of the first example embodiment comprises a first imaging system A that receives light from the illuminated region 221 of the reticle R and forms an intermediate image of the illuminated region. The optical projection system further comprises a turning mirror $M_2$ placed near the intermediate image and a second imaging system B that receives light reflected by the turning mirror $M_2$. The second imaging system B re-images the intermediate image onto a corresponding region 231 on the wafer W (FIG. 2(c)).

The first imaging system A comprises a single-pass lens group $A_1$ and a double-pass lens group $A_2$. In order from the reticle R and along an optical axis 210, the single-pass lens group $A_1$ comprises a first negative subgroup $A_{11}$ comprising a negative lens with a concave surface facing toward the reticle R and a positive lens. Continuing along the optical axis 210 from the first negative subgroup $A_{11}$, the single-pass lens group $A_1$ further comprises a positive subgroup $A_{12}$ comprising preferably a single positive lens element, and a second negative subgroup $A_{13}$ comprising a negative lens element with a concave surface facing the double-pass lens group $A_2$. The second negative subgroup $A_{13}$ is the closest of the subgroups of the single-pass lens group $A_1$ to the double-pass lens group $A_2$.

The double-pass lens group $A_2$ is placed along the optical axis 210 and receives light from the single-pass lens group $A_1$ and directs light to a concave mirror $M_1$ of the double-pass optical group $A_2$, placed on the optical axis 210. The concave mirror $M_1$ reflects light back through the double-pass lens group $A_2$. After passing through the double-pass lens group $A_2$, the light forms an image near the turning mirror $M_2$. The turning mirror $M_2$ reflects light from the first imaging system A to the second imaging system B. The turning mirror $M_2$ directs light propagating along the optical axis 210 to propagate along an optical axis 211 of the second imaging system.

The second imaging system B comprises, beginning near the turning mirror $M_2$ and proceeding along the optical axis 211, a first lens group $B_1$ and a second lens group $B_2$. An aperture S is placed between the first lens group $B_1$ and the second lens group $B_2$.

Figure 3:
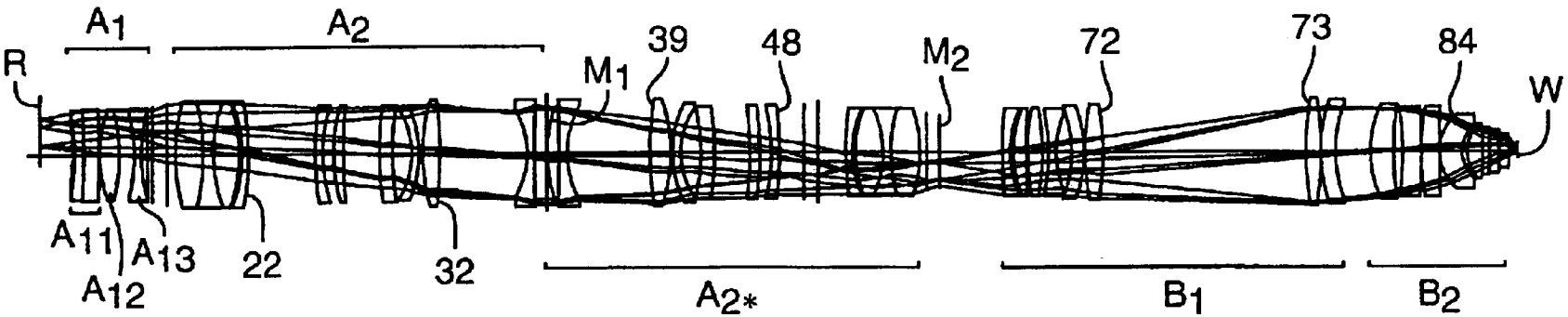
FIG. 3 is a detailed drawing of the first example embodiment of FIG. 2 with the catadioptric projection system unfolded for simplicity.

FIG. 3 shows the optical system of the first embodiment in detail. For clarity, the folded optical path caused by the concave mirror $M_1$ and the turning mirror $M_2$ has been unfolded by inserting virtual flat mirrors immediately behind the concave mirrors $M_1$ and the turning mirror $M_2$. These virtual mirrors are not actually part of the first example embodiment but serve to simplify FIG. 3. Such an unfolded representation of a catadioptric optical system will be readily understood by persons of ordinary skill in the art.

Table 1 contains specifications for the first example embodiment. In Table 1, the first column lists surface numbers, numbered from the reticle R to the wafer W. Surface numbers relevant to this discussion are specifically denoted in FIG. 3. The second, third, and fourth columns of Table 1 list the radii of curvature of the optical surfaces ("r"), surface separations ("d") along the optical axis, and the lens material, respectively. The fifth column indicates the group number for each of the optical elements. Distances are in mm. Some of the surfaces of Table 1 represent plane mirrors and other planar surfaces used to simplify FIG. 3; such surfaces do not represent actual optical elements.

Table 1 lists the elements of the double-pass lens group $A_2$ twice. Surfaces indicated as part of the lens group $A_2$ are surfaces through which pass light propagates immediately after propagating through the single-pass lens group $A_1$; the same surfaces through which the light propagates immediately after reflection from the concave mirror $M_1$ are indicated as belonging to the lens group $A_2$*. As will be apparent, the concave mirror $M_1$ is included only once.

The lenses of the first embodiment are made of synthetic fused quartz ($SiO_2$) and fluorite ($CaF_2$). Axial chromatic aberration and chromatic difference of magnification (lateral color) are corrected for a wavelength range of ±0.1 nm about a wavelength of 193 nm for use with an ultraviolet excimer laser emitting at a wavelength of 193 nm. The Abbe numbers $\nu_{193}$ given are for fluorite and synthetic fused quartz at wavelengths of 193 nm ±0.1 nm instead of the customary visible wavelengths; the refractive indices n are for a wavelength of 193 nm.

As specified in Table 1, the optical projection system of the first example embodiment provides a demagnification of the reticle R on the wafer W of ¼, a wafer-side numerical aperture of 0.6, and covers a span of 76 mm of the reticle R.

TABLE 1

(First Example Embodiment)

Lens Material Properties

| Material | Index of Refraction (n) | Abbe Number $\nu_{193}$ |
|---|---|---|
| Fused Quartz ($SiO_2$) | 1.56019 | 1780 |
| Fluorite ($CaF_2$) | 1.50138 | 2550 |

Optical System Specifications

| Surf. No. | r | d | Material | Group |
|---|---|---|---|---|
| 0 | — | 70.000000 | | R |
| 1 | −497.01528 | 15.000000 | $CaF_2$ | $A_{11}$ |
| 2 | −2089.03221 | 0.100000 | | |
| 3 | 4955.40172 | 35.000000 | $SiO_2$ | $A_{11}$ |
| 4 | −684.52303 | 0.100000 | | |
| 5 | 373.53254 | 40.000000 | $SiO_2$ | $A_{12}$ |
| 6 | −458.84391 | 32.494228 | | |
| 7 | −384.75862 | 15.000000 | $SiO_2$ | $A_{13}$ |
| 8 | 399.06352 | 11.499839 | | |
| 9 | ∞ | 0 | | |
| 10 | ∞ | 15.000000 | | |
| 11 | ∞ | 0 | | |
| 12 | ∞ | 30.000000 | | |
| 13 | ∞ | 0 | | |
| 14 | ∞ | 15.805933 | | |
| 15 | 360.53651 | 60.00000 | $CaF_2$ | $A_2$ |
| 16 | −357.18478 | 1.00000 | | |
| 17 | −410.75622 | 15.00000 | $SiO_2$ | $A_2$ |
| 18 | 272.78252 | 3.000000 | | |
| 19 | 264.76319 | 55.000000 | $CaF_2$ | $A_2$ |
| 20 | −403.51844 | 8.000000 | | |
| 21 | −313.01237 | 15.000000 | $SiO_2$ | $A_2$ |
| 22 | −536.13663 | 141.754498 | | |
| 23 | 753.93969 | 16.200000 | $SiO_2$ | $A_2$ |
| 24 | 350.20343 | 24.941513 | | |
| 25 | 502.28185 | 22.5000000 | $SiO_2$ | $A_2$ |
| 26 | 1917.58499 | 72.939269 | | |
| 27 | 696.45818 | 25.920000 | $CaF_2$ | $A_2$ |
| 28 | 422.44154 | 45.000000 | | |
| 29 | −165.29930 | 15.000000 | $SiO_2$ | $A_2$ |
| 30 | −247.15361 | 7.435835 | | |
| 31 | 447.76970 | 40.000000 | $SiO_2$ | $A_2$ |
| 32 | −650.53438 | 176.819005 | | |
| 33 | −207.03257 | 15.000000 | $SiO_2$ | $A_2$ |
| 34 | 3807.25755 | 27.000000 | | |
| 35 | ∞ | 0 | | |

TABLE 1-continued (First Example Embodiment)

| | | | | |
|---|---|---|---|---|
| 36 | 316.26451 | 27.000000 | ($M_1$) | $A_2$ |
| 37 | −3807.25755 | 15.000000 | $SiO_2$ | $A_2$* |
| 38 | 207.03257 | 176.819005 | | |
| 39 | 650.53438 | 45.000000 | $SiO_2$ | $A_2$* |
| 40 | −447.76970 | 7.435035 | | |
| 41 | 247.15361 | 15.000000 | $SiO_2$ | $A_2$* |
| 42 | 165.29930 | 45.000000 | | |
| 43 | −422.44154 | 25.920000 | $CaF_2$ | $A_2$* |
| 44 | −696.45818 | 72.939269 | | |
| 45 | −1917.58499 | 22.500000 | $SiO_2$ | $A_2$* |
| 46 | −502.28185 | 24.941513 | | |
| 47 | −350.20343 | 16.20000 | $SiO_2$ | $A_2$* |
| 48 | −753.93969 | 141.754498 | | |
| 49 | 536.13663 | 15.000000 | $SiO_2$ | $A_2$* |
| 50 | 313.01237 | 8.000000 | | |
| 51 | 403.51844 | 55.000000 | $CaF_2$ | $A_2$* |
| 52 | −264.76319 | 3.000000 | | |
| 53 | −272.78252 | 15.000000 | $SiO_2$ | $A_2$* |
| 54 | 410.75622 | 1.000000 | | |
| 55 | 357.18478 | 60.000000 | $CaF_2$ | $A_2$* |
| 56 | −360.53651 | 15.805933 | | |
| 57 | ∞ | 0 | | |
| 58 | ∞ | 30.000000 | | |
| 59 | ∞ | 0 | | |
| 60 | ∞ | 130.000000 | | $M_2$ |
| 61 | 408.08942 | 20.000000 | $SiO_2$ | $B_1$ |
| 62 | 203.49020 | 3.000000 | | |
| 63 | 207.52684 | 30.000000 | $CaF_2$ | $B_1$ |
| 64 | 19354.35793 | 0.1000000 | | |
| 65 | 429.85442 | 35.000000 | $SiO_2$ | $B_1$ |
| 66 | −403.83438 | 14.478952 | | |
| 67 | −353.07980 | 15.000000 | $SiO_2$ | $B_1$ |
| 68 | 261.24968 | 31.363884 | | |
| 69 | −219.57807 | 23.000000 | $SiO_2$ | $B_1$ |
| 70 | −348.23898 | 1.990938 | | |
| 71 | 502.56605 | 40.000000 | $CaF_2$ | $B_1$ |
| 72 | −747.25197 | 421.724019 | | |
| 73 | 638.73572 | 29.16000 | $SiO_2$ | $B_1$ |
| 74 | −809.39570 | 0.079197 | | |
| 75 | 316.55680 | 32.805000 | $SiO_2$ | $B_1$ |
| 76 | 309.57052 | 15.000000 | | |
| 77 | — | 54.627545 | | S |
| 78 | 213.28576 | 51.714104 | $CaF_2$ | $B_2$ |
| 79 | −7409.32571 | 13.778100 | | |
| 80 | −616.12401 | 39.000000 | $SiO_2$ | $B_2$ |
| 81 | −1209.66082 | 0.373771 | | |
| 82 | 472.08983 | 39.000000 | $SiO_2$ | $B_2$ |
| 83 | 1043.43948 | 0.267894 | | |
| 84 | 103.01598 | 49.409891 | $SiO_2$ | $B_2$ |
| 85 | 77.85822 | 9.349712 | | |
| 86 | 81.54405 | 32.465682 | $CaF_1$ | $B_2$ |
| 87 | 6656.48506 | 3.061800 | | |
| 88 | −400.35184 | 13.094819 | $SiO_2$ | $B_2$ |
| 89 | −922.72813 | 1.399628 | | |
| 90 | 1101.31959 | 16.951746 | $SiO_2$ | $B_2$ |
| 91 | −554.93213 | 1.641793 | | |
| 92 | 1392.34272 | 16.702978 | $SiO_2$ | $B_2$ |
| 93 | 3939.24661 | 15.000000 | | |
| 94 | ∞ | | | W |

Figure 4:
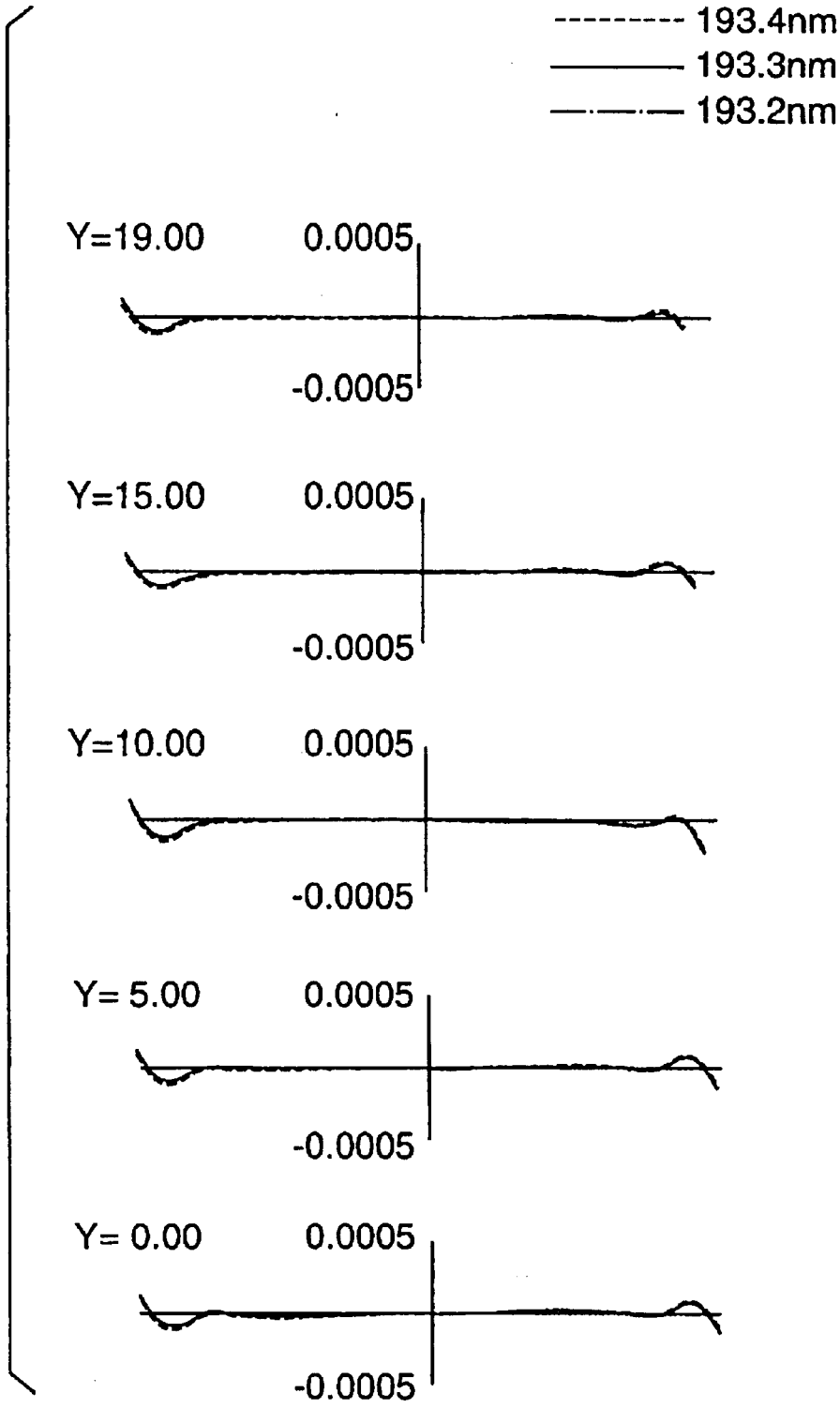
FIG. 4 contains graphs of transverse aberrations of the optical system of the first example embodiment at various image heights.

FIG. 4 provides graphs of transverse aberrations of the first example embodiment for several values of image height Y at three wavelengths. As is apparent from FIG. 4, the transverse aberrations are well-corrected even at the full numerical aperture.

In the first example embodiment, the optical projection system does not project the entire reticle R onto the wafer W in a single exposure. Rather, as shown in FIG. 2(a), an illuminated region 221 of the reticle R is projected onto a corresponding exposure region 231 on the wafer W (FIG. 2(c)). In the first embodiment, the illuminated region 221 is rectangular, 120 mm long and 24 mm wide. The length of the illuminated region 221 is symmetrically placed with respect to a line 222 perpendicular to the optical axis 210.

The width of the illuminated region 221 is such that the illuminated region 221 extends from 52 mm to 76 mm from a line 223 perpendicular to the optical axis 210.

The pattern from the entire reticle R is transferred to the wafer W by synchronously scanning both the reticle R and the wafer W during exposure of the wafer W. Arrows 241, 242 indicate the scan directions for the reticle R and the wafer W, respectively. It will be apparent that other shapes and sizes of the illuminated region can be used.

In the first example embodiment, the turning mirror $M_2$ [so] receives light reflected by the concave mirror $M_1$ and directs the light to the second imaging system B. The invention also provides an alternative arrangement in which the turning mirror $M_2$ receives light from the single-pass lens group and directs the light to the double-pass lens group and the concave mirror $M_1$. Light reflected by the concave mirror $M_2$ then propagates directly to the second imaging system without reflection by the turning mirror $M_1$. In the first example embodiment and in such a modification of the first example embodiment, the turning mirror $M_1$ thus separates light propagating from the double-pass optical group $A_2$ and light propagating to the double-pass optical group $A_2$.

Figure 5:
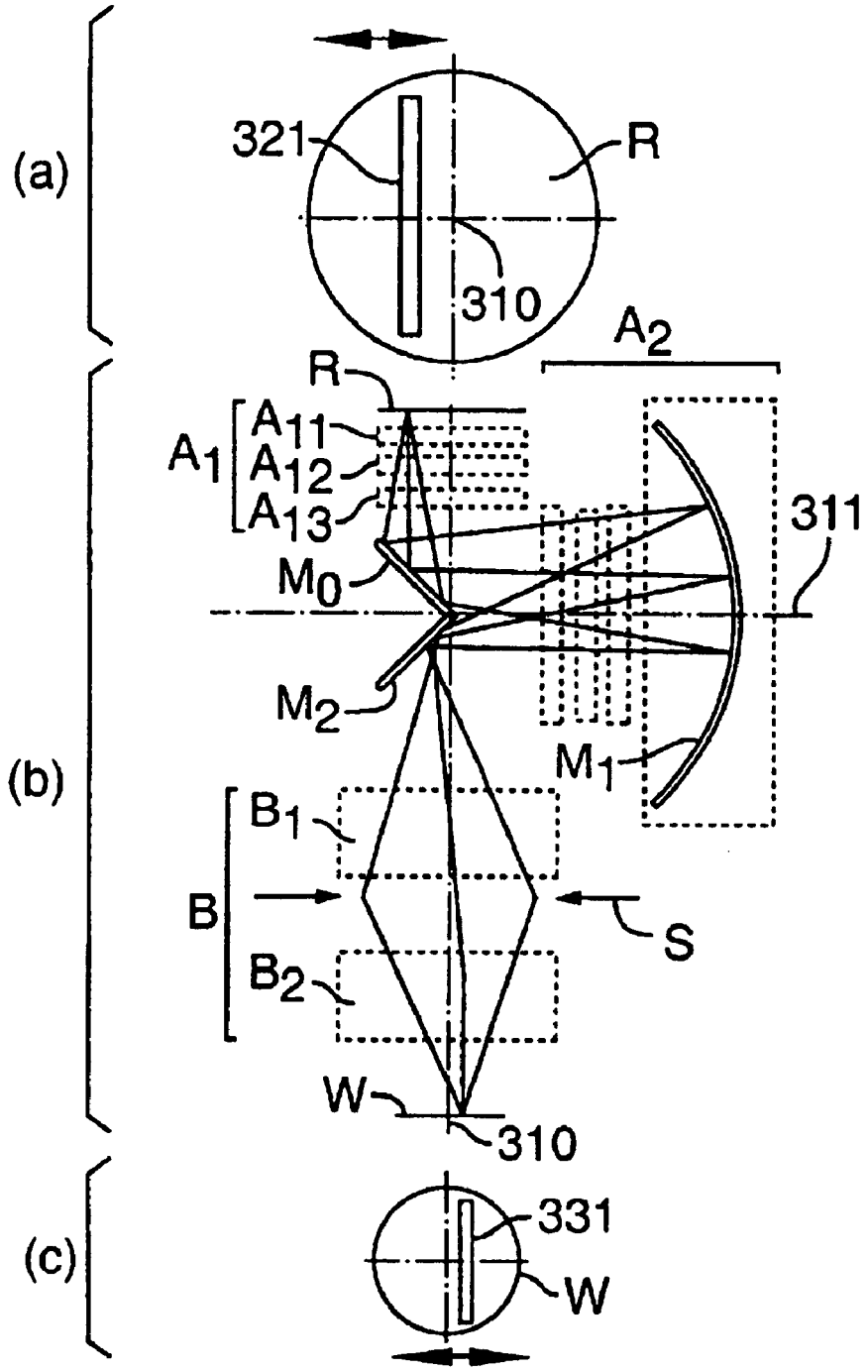
FIG. 5 shows a catadioptric projection system according to a second example embodiment of the invention.

A second example embodiment of the invention is shown in FIG. 5. The optical projection system of FIG. 5 is similar to that of the embodiment of FIG. 2. Light from an illuminated region 321 (FIG. 3(a)) of a reticle R is directed to, beginning nearest the reticle R and along an optical axis 310, a single-pass lens group $A_1$ comprising a first negative subgroup $A_{11}$, a positive subgroup $A_{12}$ and a second negative subgroup $A_{13}$. After the second negative subgroup $A_{13}$, a turning mirror [MO] $M_0$ reflects the light along an optical axis 311 of a double-pass lens group $A_2$ including a concave mirror [MI] $M_1$. Light is transmitted by the double-pass lens group $A_2$ and is reflected by the concave mirror $M_1$ back through the double-pass lens group $A_2$ to a turning mirror $M_2$. An intermediate image of the illuminated region 321 is formed near the turning mirror $M_2$.

The turning mirror $M_2$ directs the light from the [illuminated] *illuminated* region of the reticle R along the optical axis 310 which is an optical axis of the second imaging system B as well as of the single-pass lens group $A_1$. The second imaging system B receives light from the turning mirror $M_2$ and re-images the intermediate image onto a corresponding region 331 on the wafer W. As will be apparent, the second embodiment differs from the first embodiment in that the turning mirror $M_0$ is placed between the single-pass lens group $A_1$ and the double-pass lens group $A_2$. The turning mirror $M_0$ permits the reticle R and the wafer W to be in parallel planes. As shown in FIG. 5, the reticle R and the wafer W are along the same optical axis 312.

With reference to FIG. 6, an optical system according to a third example embodiment of the invention differs from the first embodiment in that a turning mirror $M_3$ is placed between the first lens group $B_1$ and the second lens group $B_2$ of the second imaging system B. As a result of the reflection by the turning mirror $M_3$, the optical system of the third example embodiment transfers a pattern from an illuminated region 421 of the reticle R (FIG. 6(a)) to the wafer W wherein the reticle R and the wafer W are in parallel planes. Unlike the second example embodiment, the wafer W and the reticle R of the third example embodiment are on separate optical axes 401, 402 of the first imaging system A and the second lens group $B_2$ of the second imaging system B, respectively.

In the third example embodiment, the turning mirror $M_2$ receives light reflected by the concave mirror $M_1$ and directs the light to the second imaging system B. The invention also provides an alternative arrangement in which the turning mirror $M_2$ receives light from the single-pass lens group and directs the light to the double-pass lens group and the concave mirror $M_1$. Light reflected by the concave mirror $M_2$ then propagates directly to the second imaging system without reflection by the turning mirror $M_1$.

The first, second, and third example embodiments are similar to each other, but differing in respect to the number and placement of turning mirrors. Therefore, these example embodiments provide the same image quality.

In each of the example embodiments described above, the single-pass lens group $A_1$ comprises a first negative subgroup, a positive subgroup, and a second negative subgroup. The catadioptric projection systems of this invention are readily miniaturized with no loss of image quality. While FIGS. 2, 5, and 6 show a scanning exposure of the wafer W, the catadioptric projection systems of this invention can also be used for full-field exposure.

The catadioptric projection systems of the present invention include several other favorable characteristics. First, a turning mirror (or a beamsplitter) can be placed near the intermediate image, thereby reducing the size of the turning mirror. Second, unlike conventional catadioptric projection systems that allow light reflected by a mirror to overlap with the incident light (which makes placement of the aperture S difficult), the catadioptric projection systems of the present invention allow the aperture S to be placed in the second imaging system B so that the ratio of the numerical apertures of an irradiation optical system to the catadioptric projection system $\sigma$ can be easily varied. Third, by increasing the number of lens elements in the second imaging system B, the numerical aperture of the catadioptric projection system according to the invention can be increased. Fourth, re-imaging the intermediate image by the second imaging system B provides a long working distance. Fifth, the catadioptric projection systems of the invention are compact. Finally, because light reflected from the concave mirror $M_1$ is returned near the focused image, off-axis lens aberrations are reduced.

With the additional turning mirrors of the second and third example embodiments, the relative orientations of the reticle R and the wafer W can be adjusted. I.e., the second example embodiment, the reticle R and wafer W are parallel to each other and on the same optical axis. In the third example embodiment, the reticle R and the wafer W are parallel to each other but are situated on offset but parallel optical axes. Thus, the present invention permits orienting the reticle R and the wafer W in a way allowing simplification of the scanning systems.

The catadioptric projection systems of the example embodiments also permit the turning mirrors to closely approach the respective optical axes. Therefore, light reflected by the concave mirror $M_1$ back through the double-pass lens group $A_2$ is easily separated from the light propagating from the single-pass lens group $A_1$ to the double-pass lens group $A_2$. Because the turning mirror or mirrors are situated close to the respective optical axes, light need not propagate at large angles with respect to the optical axes and off-axis aberrations are reduced. Prior-art systems often require angles of 20° or more while the catadioptric projection systems of this invention use angles no greater than about 10°.

Some prior-art scanning projection systems expose an annulus of the wafer from a corresponding annular illuminated region of the reticle. The reticle and wafer are scanned at different speeds corresponding to the magnification of the optical projection system. Because such scanning exposure systems expose only small areas of the wafer W at any give instant, complete exposure of the wafer W requires many incremental exposures. If the light from a radiation source is used inefficiently, exposure times will be long. Because the catadioptric projection systems of this invention do not require large angles for separating light incident to and exiting from the concave mirror, the catadioptric projection systems can have high numerical apertures, thereby reducing exposure times.

Because the first imaging system A and the second imaging system B are independent of each other, manufacture and alignment are simple.

Having illustrated and demonstrated the principles of the invention in a example embodiments, it should be apparent to those skilled in the art that the example embodiments can be modified in arrangement and detail without departing from such principles. I claim as the invention all that comes within the scope of these claims.

What is claimed is:

1. A catadioptric projection system for receiving light from a reticle and projecting a pattern from the reticle onto a substrate, the catadioptric projection system comprising:

a first imaging system that forms an intermediate image of an illuminated region of the reticle, the first imaging system comprising in order from the reticle and along an optical axis of the first imaging system, (a) a single-pass lens group comprising a first negative subgroup, a positive subgroup, and a second negative subgroup, and (b) a double-pass lens group comprising a concave mirror, wherein light from the illuminated region of the reticle passes through the single-pass lens group and the double-pass lens group, reflects from the concave mirror, and returns through the double-pass optical group;

a first turning mirror placed near the intermediate image that receives the light reflected by the concave mirror [to] and returned through the double-pass optical group; and a second imaging system that receives the light reflected by the first turning mirror and that re-images the intermediate image to form a final image of the illuminated region of the reticle on the substrate.

2. The catadioptric projection system of claim 1, wherein the first negative subgroup of the single-pass lens group comprises a lens element with a concave surface facing the reticle.

3. The catadioptric projection system of claim 1, wherein the second negative subgroup of the single-pass lens group comprises a lens element with a concave surface facing the double-pass lens group.

4. The catadioptric projection system of claim 2, wherein the second negative subgroup of the single-pass lens group comprises a lens [clement] *element* with a concave surface facing the double-pass lens group.

5. The catadioptric projection system of claim 1, wherein either the first imaging system or the second imaging system produces a magnification of less than one.

6. The catadioptric projection system of claim 1, wherein the second imaging system comprises a first lens group and a second lens group, the system further comprising a second turning mirror placed between the first lens group and the second lens group and that receives light from the first lens group and directs the light to the second lens group.

7. The catadioptric projection system of claim 1, further comprising a third turning mirror placed between the single-pass lens group and the double-pass lens group and that receives light from the single-pass lens group and directs the light to the double-pass lens group.

8. The catadioptric projection system of claim 7, wherein the third turning mirror and the first turning mirror are arranged so that the light incident to the single-pass optical group and exiting the second lens group of the second imaging system propagate along substantially parallel axes.

9. The catadioptric projection system of claim 8, wherein the first axis and the second axis are colinear.

10. A catadioptric projection system for receiving light [so] from a reticle and projecting a pattern from the reticle onto a substrate, the catadioptric projection system comprising:

a first imaging system that forms an intermediate image of an illuminated region of the reticle, the first imaging system comprising from objectwise to [imagewisc] *imagewise*, (a) a single-pass lens group comprising a first negative subgroup, a positive subgroup, and a second negative subgroup, and (b) a double-pass lens group comprising a concave mirror, wherein light from the illuminated region of the reticle passes through the single-pass lens group and the double-pass lens group, reflects from the concave mirror, and returns through the double-pass lens group;

a first turning mirror placed near the intermediate image, the first turning mirror separating the light propagating from the double-pass lens group from the light propagating to the double-pass lens group; and a second imaging system that receives the light reflected by the concave mirror and reflected back through the double-pass lens group and that re-images the intermediate image to form a final image of the illuminated region of the reticle on the substrate.

11. The catadioptric projection system of claim 10, wherein the first negative subgroup of the single-pass lens group comprises a lens element with a concave surface facing the reticle.

12. The catadioptric projection system of claim 10, wherein the second negative subgroup of the single-pass lens group comprises a lens element with a concave surface facing the first turning mirror.

13. The catadioptric projection system of claim 11, wherein the second negative subgroup of the single-pass lens group comprises a lens element with a concave surface facing the first turning mirror.

14. The catadioptric projection system of claim 10, wherein either the first imaging system or the second imaging system produces a magnification of less than one.

15. The catadioptric projection system of claim 10, wherein the second imaging system comprises a first lens group and a second lens group, the system further comprising a second turning mirror placed between the first lens group and the second lens group and that receives light from the first lens group and directs the light to the second lens group.

16. The catadioptric projection system of claim 14, wherein the first turning mirror and the second turning mirror are arranged so that light entering the single-pass lens group propagates along a first axis and light reflected by the second turning mirror propagates along a second axis substantially parallel to the first axis.

17. In a method for projecting a pattern on a reticle onto a substrate in which a first imaging system receives light from the reticle and transmits the light through a single-pass lens group of the first imaging system and a double-pass lens group of the first imaging system, the double-pass lens group comprising a concave mirror, and reflecting the light from the concave mirror and returning the light through the double-pass optical group, and separating the light propagating from the double-pass lens group and the light propagating to the double-pass lens group, and directing the light propagating from the double-pass lens group to a second imaging system, an improvement comprising:

(a) providing within the single-pass lens group, from objectwise to imagewise, a first negative subgroup, a positive subgroup, and a second negative subgroup;

(b) forming an intermediate image with the first imaging system between the first imaging system and the second imaging system; and (c) locating the intermediate image in proximity to a turning mirror that separates the light propagating from the double-pass lens group from the light propagating to the double-pass lens group.

18. A method for projecting a pattern from a reticle onto a substrate, comprising the steps of:

(a) providing a first imaging system comprising a single-pass lens group including from objectwise to imagewise, a first negative lens subgroup, a positive lens subgroup, and a second negative lens subgroup; and a double-pass lens group comprising a concave mirror;

(b) transmitting light from the reticle through the single-pass lens group and the double-pass lens group to the concave mirror, and returning the light reflected from the concave mirror back through the double-pass lens group toward the single-pass lens group;

(c) separating the light propagating through the double-pass lens group to the concave mirror from the light propagating through the double-pass lens group from the concave mirror;

(d) with the first imaging system, forming an intermediate image of the pattern between the first imaging system and the second imaging system;

(e) directing the light propagating from the concave mirror through the second imaging system; and (f) forming an image of the reticle on the substrate with the second imaging system.

19. The method of claim 18, further comprising directing light from the single-pass lens group to the double-pass lens group using a first turning mirror.

20. The method of claim 19, further comprising directing the light, reflected by the concave mirror and returning through the double-pass lens group, to the second imaging system using a second turning mirror.

21. The method of claim 20, further comprising orienting the first turning mirror and the second turning mirror so that the light incident to the first turning mirror and the light reflected by the second turning mirror propagate along substantially parallel axes.

22. The method of claim 21, further comprising orienting the first turning mirror and the second turning mirror so that the light incident to the first turning mirror and the light reflected by the second turning mirror propagate along substantially the same axis.

23. The method of claim 18, further comprising:

providing a first turning mirror placed between the single-pass lens group and the double-pass lens group; and directing light, returning through the double-pass lens group from the concave mirror, to the second imaging system using the first turning mirror.

24. The method of claim 23, further comprising:

providing the second imaging system with a first lens group and a second lens group;

providing a second turning mirror between the first lens group and the second lens group; and directing light from the first lens group to the second lens group using the second turning mirror.

25. The method of claim 24, further comprising:

arranging the first turning mirror and the second turning mirror so that the light incident to the first turning mirror and the light reflected by the second turning mirror propagate along substantially parallel axes.

26. An exposure system for projecting patterns on a reticle onto a substrate, the system comprising:

(a) a catadioptric projection system that receives an illumination flux from an illuminated region on the reticle and forms an image of the illuminated region on the reticle on a corresponding region on the substrate;

(b) the catadioptric projection system comprising a first imaging system and a second imaging system, the first imaging system forming an intermediate image of the illuminated region of the reticle, and the second imaging system serving to re-image the intermediate image to form an image of the illuminated region of the reticle on the corresponding region of the substrate;

(c) the first imaging system comprising from objectwise to imagewise, (i) a single-pass lens group comprising a first negative subgroup, a positive subgroup, and a second negative subgroup; and (ii) a double-pass lens group comprising a concave mirror, wherein light from the illuminated region of the reticle passes through the single-pass lens group and the double-pass lens group, reflects from the concave mirror, and returns through the double-pass lens group;

(d) a first turning mirror situated near the intermediate image, the first turning mirror separating the light propagating from the double-pass lens group from the light propagating to the double-pass lens group; and (e) a reticle scanner and a substrate scanner for respectively scanning the reticle and substrate synchronously to allow the [caladioptric] *catadioptric* projection system to project the patterns on the reticle onto the substrate.

*27. A catadioptric imaging optical system in a projection exposure apparatus that transfers a pattern on a reticle which is arranged in a first plane onto a substrate which is arranged in a second plane, the system comprising:*

*a catadioptric imaging optical sub-system comprising an optical group to form an image of the pattern, the optical group comprising a concave mirror with a first optical axis; and*

*a dioptric imaging sub-system arranged in an optical path between the catadioptric imaging optical sub-system and the second plane to re-image the image formed by the catadioptric imaging optical sub-system, the dioptric imaging sub-system comprising a second optical axis,*

*wherein*

*the first optical axis and the second optical axis are not parallel to each other,*

*the first plane and the second plane are arranged to be parallel to each other,*

*the optical group of said catadioptric imaging optical sub-system comprises a first optical subgroup comprising a third optical axis, and a second optical*

*subgroup comprising the concave mirror and the first optical axis, and*

*the second and third axes form a straight optical axis.*

*28. A catadioptric imaging optical system according to claim 27, wherein the third optical axis and the second optical axis are parallel to each other.*

*29. A catadioptric imaging optical system according to claim 27, wherein the second optical subgroup comprises a negative lens and a positive lens.*

*30. A catadioptric imaging optical system according to claim 27, wherein said dioptric imaging optical sub-system further comprises an aperture stop.*

*31. A projection exposure apparatus that transfers a pattern on a reticle onto a substrate, comprising:*

*an illumination optical system to illuminate the pattern on the reticle; and*

*a catadioptric imaging optical system according to claim 30 to image the pattern onto the substrate,*

*wherein a σ can be varied, σ being a ratio of a numerical aperture of said catadioptric imaging optical system to a numerical aperture of said illumination optical system.*

*32. A catadioptric imaging optical system according to claim 27, wherein the image formed by said catadioptric imaging optical sub-system is a primary image of the pattern on the reticle.*

*33. A catadioptric imaging optical system according to claim 27, further comprising a first turning mirror arranged in an optical path between the concave mirror and said dioptric imaging optical sub-system.*

*34. A catadioptric imaging optical system according to claim 33, further comprising a second turning mirror arranged in an optical path between the concave mirror and the first plane.*

*35. A catadioptric imaging optical system according to claim 34, wherein the third optical axis and the second optical axis intersect.*

*36. A projection exposure apparatus that transfers a pattern on a reticle onto a substrate, comprising:*

*a catadioptric imaging optical system according to claim 27, said catadioptric imaging optical system forms an exposure region on the substrate that is off of the second optical axis.*

*37. A projection exposure apparatus according to claim 36, wherein the reticle and the substrate are scanned at different speeds corresponding to the magnification of said catadioptric imaging optical system.*

*38. A method of imaging a pattern on a reticle which is arranged in a first plane onto a substrate which is arranged in a second plane, comprising:*

*forming an intermediate image of the pattern on the reticle using a catadioptric imaging optical sub-system, wherein the catadioptric imaging optical sub-system comprises an optical group comprising a concave mirror with a first optical axis; and*

*re-imaging the intermediate image formed by the catadioptric imaging optical sub-system onto the substrate using a dioptric imaging sub-system arranged in an optical path between the catadioptric imaging optical sub-system and the second plane, wherein the dioptric imaging sub-system comprises a second optical axis,*

*wherein*

*the first optical axis and the second optical axis intersect,*

*the first plane and the second plane are arranged to be parallel to each other,*

*the optical group of said catadioptric imaging optical sub-system comprises a first optical subgroup comprising a third optical axis, and a second optical subgroup comprising the concave mirror and the first optical axis, and*

*the second and third optical axes form a straight optical axis.*

*39. A catadioptric imaging optical system used in a projection exposure apparatus that transfers a pattern on a reticle which is arranged in a first plane onto a substrate which is arranged in a second plane, comprising:*

*a catadioptric imaging optical sub-system in an optical path between the first plane and the second plane, the catadioptric imaging optical sub-system comprising*

*a first optical group with a lens with a first optical axis, and*

*a second optical group with a concave mirror with a second optical axis; and*

*a dioptric imaging sub-system with a third optical axis arranged in an optical path between said catadioptric imaging optical sub-system and said substrate,*

*wherein*

*the first optical axis and second optical axis intersect,*

*the second optical axis and the third optical axis intersect, and*

*the first and third optical axes form a straight optical axis.*

*40. A projection exposure apparatus that transfers a pattern on a reticle onto a substrate, comprising:*

*a catadioptric imaging optical sub-system according to claim 39,*

*wherein said catadioptric imaging optical system forms the pattern on the reticle that is off of the first optical axis onto an exposure region on the substrate that is off of the third optical axis.*

*41. A projection exposure apparatus according to claim 40, wherein the reticle and the substrate are scanned at different speeds corresponding to the magnification of said catadioptric imaging optical sub-system.*

*42. A catadioptric imaging optical system according to claim 39, wherein the first and third optical axes are parallel to each other.*

*43. A method of imaging a pattern on a reticle onto a substrate, comprising:*

*passing a light from the reticle through a first optical group comprising a lens with a first optical axis;*

*forming an intermediate image by a light passing through the first optical group and a second optical group, the second optical group comprising a concave mirror with a second optical axis; and*

*guiding a light having passes through the second optical group to the substrate by passing the light through a dioptric imaging optical sub-system with a third optical axis,*

*wherein*

*the first optical axis and the second optical axis intersect,*

*the second optical axis and the third optical axis intersect, and*

*the first and third optical axes form a straight optical axis.*

*44. A method according to claim 43, wherein in said forming comprises forming a primary image of the reticle.*

*45. A method according to claim 43, wherein the first and third optical axes are parallel to each other.*

*46. A catadioptric imaging optical system used in a projection exposure apparatus that transfers a pattern on a*

*reticle which is arranged in a first plane onto a substrate which is arranged in a second plane, comprising:*

*a first turning mirror arranged in an optical path between the first plane and the second plane;*

*a concave mirror arranged in an optical path between the first turning mirror and the second plane;*

*a second turning mirror arranged in an optical path between the concave mirror and the second plane; and*

*a dioptric imaging optical sub-system arranged in an optical path between the second turning mirror and the second plane and comprising an optical axis,*

*wherein*

*the first plane and the second plane are arranged to be parallel to each other, and*

*a first reflection surface of the first turning mirror and a second reflection surface of the second turning mirror are arranged to be non-parallel with each other.*

*47. A projection exposure apparatus that transfers a pattern on a reticle onto a substrate, comprising a catadioptric imaging optical system according to claim 46, wherein said catadioptric imaging optical system forms the pattern on the reticle off of the optical axis onto an exposure region on the substrate off of the optical axis.*

*48. A projection exposure apparatus according to claim 47, wherein the reticle and the substrate are scanned at different speeds corresponding to the magnification of said catadioptric imaging optical system.*

*49. A catadioptric imaging optical system according to 46, wherein the optical axis of said dioptric imaging optical sub-system forms a straight line.*

*50. A method of imaging a pattern on a reticle which is arranged in a first plane onto a substrate which is arranged in a second plane, comprising:*

*reflecting a light from the reticle with a first reflection surface of a first turning mirror;*

*reflecting the light from the first turning mirror with a concave mirror;*

*reflecting the light from the concave mirror using a second reflection surface of a second turning mirror;*

*passing the light from the second turning mirror to the substrate through a dioptric imaging optical sub-system having an optical axis;*

*forming an intermediate image of the pattern in an optical path between the concave mirror and the dioptric imaging optical sub-system; and*

*forming an image of the intermediate image on the substrate by the dioptric imaging optical sub-system,*

*wherein*

*the first plane and the second plane are arranged in parallel to each other, and*

*the first and second reflection surfaces are arranged to be non-parallel with each other.*

*51. A method according to claim 50, wherein said intermediate image is a primary image of the reticle.*

*52. A method according to claim 50, wherein the dioptric imaging optical sub-system comprises an optical axis along a straight line.*

*53. A catadioptric imaging optical system used in a projection exposure apparatus that transfers a pattern on a reticle which is arranged in a first plane onto a substrate which is arranged in a second plane, comprising:*

*a catadioptric imaging optical sub-system in an optical path between the first plane and the second plane, the catadioptric imaging optical sub-system comprising*

*a first optical group with a lens with a first optical axis, and*

*a second optical group with a concave mirror with a second optical axis; and*

*a dioptric imaging sub-system with a third optical axis arranged in an optical path between the catadioptric imaging optical sub-system and the second plane,*

*wherein*

*the first optical axis and second optical axis intersect, and*

*the second optical axis and the third optical axis intersect*

*the first and third optical axes are parallel to each other, and*

*the first and third optical axes form a straight optical axis.*

*54. A method of imaging a pattern on a reticle onto a substrate, comprising:*

*passing a light from the reticle through a first optical group comprising a lens with a first optical axis;*

*forming an intermediate image by a light passing through the first optical group and a second optical group, the second optical group comprising a concave mirror with a second optical axis; and*

*guiding a light having passes through the second optical group to the substrate by passing the light through a dioptric imaging optical sub-system with a third optical axis,*

*wherein*

*the first optical axis and the second optical axis intersect, and*

*the second optical axis and the third optical axis intersect,*

*the first and third optical axes are parallel to each other, and*

*the first and third optical axes form a straight optical axis.*

*55. A method for projecting a pattern from a reticle onto a substrate, comprising:*

*transmitting light from the reticle through a first imaging system, where the transmitted light pass through a single-pass lens group and a double-pass lens group to a concave mirror, and the light is reflected from the concave mirror back through the double-pass lens group toward the single-pass lens group;*

*separating the light propagating through the double-pass lens group to the concave mirror from the light propagating through the double-pass lens group from the concave mirror;*

*with the first imaging system, forming an intermediate image of the pattern between the first imaging system and a second imaging system;*

*directing the light propagating from the concave mirror through the second imaging system; and*

*forming an image of the reticle on the substrate with the second imaging system, wherein*

*the single-pass lens group includes from objectwise to imagewise, a first negative lens subgroup, a positive lens subgroup, and a second negative lens subgroup, and*

*the double-pass lens group includes the concave mirror.*

*56. A catadioptric imaging optical system in a projection exposure apparatus that transfers a pattern on a reticle which is arranged in a first plane onto a substrate which is arranged in a second plane, the system comprising:*

*a catadioptric imaging optical sub-system comprising an optical group to form an image of the pattern, the optical group comprising a concave mirror with a first optical axis; and*

*a dioptric imaging sub-system arranged in an optical path between the catadioptric imaging optical sub-system and the second plane to re-image the image formed by the catadioptric imaging optical sub-system, the dioptric imaging sub-system comprising a second optical axis,*

*wherein*

*the first optical axis and the second optical axis are not parallel to each other,*

*the first plane and the second plane are arranged to be parallel to each other, and*

*the dioptric imaging optical sub-system further comprises an aperture stop.*

*57. A catadioptric imaging optical system in a projection exposure apparatus that transfers a pattern on a reticle which is arranged in a first plane onto a substrate which is arranged in a second plane, the system comprising:*

*a catadioptric imaging optical sub-system comprising an optical group to form an image of the pattern, the optical group comprising a concave mirror with a first optical axis; and*

*a dioptric imaging sub-system arranged in an optical path between the catadioptric imaging optical sub-system and the second plane to re-image the image formed by the catadioptric imaging optical sub-system, the dioptric imaging sub-system comprising a second optical axis;*

*wherein*

*the first optical axis and the second optical axis are not parallel to each other,*

*the first plane and the second plane are arranged to be parallel to each other,*

*the optical group of said catadioptric imaging optical sub-system comprises:*

*a first subgroup comprising a third optical axis, and*

*a second subgroup comprising the concave mirror and the first optical axis, and*

*the third optical axis and the second optical axis intersect.*

*58. A method of imaging a pattern on a reticle which is arranged in a first plane onto a substrate which is arranged in a second plane, comprising:*

*forming an intermediate image of the pattern on the reticle using a catadioptric imaging optical sub-system, the catadioptric imaging optical sub-system comprising an optical group comprising a concave mirror and a first optical axis; and*

*re-imaging the intermediate image formed by the catadioptric imaging optical sub-system onto the substrate using a dioptric imaging sub-system arranged in an optical path between the catadioptric imaging optical sub-system and the second plane, the dioptric imaging sub-system comprising a second optical axis,*

*wherein*

*the first optical axis and the second optical axis intersect,*

*the first plane and the second plane are arranged to be parallel with each other, and*

*the dioptric imaging sub-system comprises an aperture stop.*

*59. A method of imaging a pattern on a reticle which is arranged in a first plane onto a substrate which is arranged in a second plane, comprising:*

*forming an intermediate image of the pattern of the reticle using a catadioptric imaging optical sub-system, the catadioptric imaging optical sub-system comprising an optical group comprising a concave mirror and a first optical axis; and*

*re-imaging the intermediate image formed by the catadioptric imaging optical sub-system onto the substrate using a dioptric imaging sub-system arranged in an optical path between the catadioptric imaging optical sub-system and the second plane, the dioptric imaging sub-system comprising a second optical axis,*

*wherein*

*the first optical axis and the second optical axis intersect,*

*the first plane and the second plane are arranged to be parallel with each other, and*

*the optical group of the catadioptric imaging optical sub-system comprises a first subgroup comprising a third optical axis, and a second subgroup comprising the concave mirror and the first optical axis, and*

*the third optical axis and the second optical axis intersect.*

*60. A catadioptric imaging optical system in a projection exposure apparatus that transfers a pattern on a reticle which is arranged in a first plane onto a substrate which is arranged in a second plane, the system comprising:*

*a catadioptric imaging optical sub-system comprising an optical group to form an image of the pattern, the optical group comprising a concave mirror with a first optical axis;*

*a dioptric imaging sub-system arranged in an optical path between the catadioptric imaging optical sub-system and the second plane to re-image the image formed by the catadioptric imaging optical sub-system, the dioptric imaging sub-system comprising a second optical axis;*

*a first turning mirror arranged in an optical path between the concave mirror and the dioptric imaging optical sub-system; and*

*a second turning mirror arranged in an optical path between the concave mirror and the first plane,*

*wherein*

*the first optical axis and the second optical axis are not parallel to each other,*

*the reticle and the substrate are arranged to be parallel to each other,*

*the optical group of said catadioptric imaging optical sub-system comprises:*

*a first subgroup comprising a third optical axis, and*

*a second subgroup comprising the concave mirror and the first optical axis; and*

*the third optical axis and the second optical axis intersect.*

* * * * *

UNITED STATES PATENT AND TRADEMARK OFFICE

CERTIFICATE OF CORRECTION

PATENT NO. : RE 39,296 E
APPLICATION NO. : 09/659375
DATED : September 19, 2006
INVENTOR(S) : Tomowaki Takahashi It is certified that error appears in the above-identified patent and that said Letters Patent is hereby corrected as shown below:

Column 15, Line 3, after “third” insert --optical--

Column 18, Line 10, delete “and”

Column 18, Line 12, after “intersect”, insert--,--

Column 18, Line 31, after “intersect,” delete “and”.

Column 20, Line 6, delete “of” second occurrence and insert --on--.

Column 20, Line 21, after “each other,” delete “and”

Signed and Sealed this

Eighth Day of May, 2007

JON W. DUDAS
*Director of the United States Patent and Trademark Office*